United States Patent
Han

(10) Patent No.: US 9,393,642 B2
(45) Date of Patent: Jul. 19, 2016

(54) SEALING APPARATUS, SUBSTRATE-SEALING APPARATUS INCLUDING THE SAME AND SUBSTRATE-SEALING METHOD

(71) Applicant: Samsung Display Co., Ltd., Yongin, Gyeonggi-Do (KR)

(72) Inventor: Jeong-Won Han, Yongin (KR)

(73) Assignee: Samsung Display Co., Ltd. (KR)

( * ) Notice: Subject to any disclaimer, the term of this patent is extended or adjusted under 35 U.S.C. 154(b) by 352 days.

(21) Appl. No.: 14/218,658

(22) Filed: Mar. 18, 2014

(65) Prior Publication Data

US 2015/0048070 A1 Feb. 19, 2015

(30) Foreign Application Priority Data

Aug. 14, 2013 (KR) ........................ 10-2013-0096898

(51) Int. Cl.

| | |
|---|---|
| *H01L 25/04* | (2014.01) |
| *B23K 26/20* | (2014.01) |
| *B23K 26/00* | (2014.01) |
| *H01L 51/52* | (2006.01) |
| *H01L 51/56* | (2006.01) |
| *B23K 26/04* | (2014.01) |
| *B23K 26/073* | (2006.01) |

(52) U.S. Cl.
CPC ........... *B23K 26/0063* (2013.01); *B23K 26/046* (2013.01); *B23K 26/073* (2013.01); *B23K 26/206* (2013.01); *H01L 25/043* (2013.01); *H01L 51/5246* (2013.01); *H01L 51/56* (2013.01)

(58) Field of Classification Search
CPC ........................... H01L 25/043; B23K 26/206
USPC ........................... 445/25; 219/121.62, 121.85
See application file for complete search history.

(56) References Cited

U.S. PATENT DOCUMENTS

| | | | | |
|---|---|---|---|---|
| 8,434,328 | B2 * | 5/2013 | Lamberson | ............... C03C 3/21 501/15 |
| 2009/0064717 | A1 | 3/2009 | Son et al. | |
| 2009/0086325 | A1 | 4/2009 | Liu et al. | |
| 2009/0233513 | A1 | 9/2009 | Lee et al. | |
| 2009/0233514 | A1 | 9/2009 | Lee et al. | |
| 2010/0154476 | A1 | 6/2010 | Becken et al. | |

FOREIGN PATENT DOCUMENTS

| | | |
|---|---|---|
| KR | 10-2007-0083148 | 8/2007 |
| KR | 10-2007-0088715 | 8/2007 |
| KR | 10-2009-0026421 | 3/2009 |
| KR | 10-2009-0093187 | 9/2009 |
| KR | 10-2009-0098187 | 9/2009 |
| KR | 10-2009-0098496 | 9/2009 |
| KR | 10-2010-0072315 | 6/2010 |
| KR | 10-2012-0012672 | 2/2012 |

\* cited by examiner

*Primary Examiner* — Samuel M Heinrich

(74) *Attorney, Agent, or Firm* — Innovation Counsel LLP

(57) ABSTRACT

The sealing apparatus includes a measuring unit moving above a sealing unit to measure a pattern of the sealing unit, a laser beam irradiation device moving along the measuring unit to irradiate a laser beam onto the sealing unit, and a control unit controlling a moving path and a size of a focusing area of the laser beam irradiation device according to the pattern of the sealing unit that is measured in the measuring unit.

13 Claims, 5 Drawing Sheets

SEALING APPARATUS, SUBSTRATE-SEALING APPARATUS INCLUDING THE SAME AND SUBSTRATE-SEALING METHOD

RELATED APPLICATIONS

This application claims the benefit of Korean Patent Application No. 10-2013-0096898, filed on Aug. 14, 2013, in the Korean Intellectual Property Office, the disclosure of which is incorporated herein in its entirety by reference.

BACKGROUND

1. Field

One or more embodiments of the inventive concept relate to a sealing apparatus, a substrate-sealing apparatus, and a substrate-sealing method used by the sealing apparatus.

2. Description of the Related Art

Recently, display devices have been replaced with thin flat panel display devices. Among the flat panel display devices, an electroluminescent display device is a self-light-emitting display device which has wide viewing angles, excellent contrast, and fast response time. Therefore, the electroluminescent display is receiving attention as a next-generation display device. An organic light-emitting display device, in which a light-emitting layer is formed of an organic material, has excellent luminance, low driving voltage, and fast response time in comparison with an inorganic light-emitting display device, and enables multi-colorization.

Typical organic light-emitting display devices have a structure in which at least one organic layer, including an emission layer, is interposed between two electrodes.

When moisture or oxygen is introduced into a typical organic light-emitting display device from the atmosphere, an electrode material may be oxidized or exfoliated to reduce the life span and the light-emitting efficiency of the typical organic light-emitting device and to deteriorate light-emitting colors.

Accordingly, when an organic light-emitting display device is manufactured, an organic light-emitting device (OLED) is usually isolated from the atmosphere and sealed to prevent moisture and oxygen from being introduced. Examples of the sealing methods include a method in which an inorganic thin film and an organic polymer such as polyester (PET) are laminated on a second electrode of the organic light-emitting display device and a method in which an absorbent is formed in an encapsulation substrate. Nitrogen gas is filled in the encapsulation substrate and a boundary of the encapsulation substrate is sealed using a sealant such as epoxy.

However, it is impossible for these methods to completely block factors such as moisture or oxygen introduced from the outside, which destroys the organic OLED. Thus, these methods may be inappropriate for the organic light-emitting display devices that are particularly vulnerable to moisture. Moreover, a process for realizing the methods is also complicated. In order to solve these problems, a method in which a frit is used as a sealant to improve adhesion between an OLED substrate and the encapsulation substrate has been designed.

Because the frit is applied on a glass substrate to seal the organic light-emitting display device, the OLED substrate and the encapsulation substrate may be completely sealed to more effectively protect the organic light-emitting display device.

According to the method in which the substrate is sealed by using the frit, the frit is applied to each of sealing units of the organic light-emitting display device, Laser beams are irradiated onto the sealing units of the organic light-emitting display device while moving a laser beam irradiation device. The frit is cured, thereby sealing the substrate by using the laser beam irradiation device.

SUMMARY

One or more embodiments of the inventive concept include a sealing apparatus capable of improving sealing quality, a substrate-sealing apparatus and a substrate-sealing method used by the sealing apparatus.

Additional aspects will be set forth in part in the description which follows and, in part, will be apparent from the description, or may be learned by practice of the presented embodiments.

According to one or more embodiments of the inventive concept, a sealing apparatus includes: a measuring unit moving along a sealing unit to measure a pattern of the sealing unit; a laser beam irradiation device moving along the measuring unit and configured to irradiate a laser beam onto the sealing unit; and a control unit controlling a moving path and a size of a focusing area of the laser beam irradiation device according to the pattern of the sealing unit that is measured in the measuring unit.

The laser beam irradiation device has a vertical part configured to control the distance between the laser beam irradiation device and the sealing unit.

The laser beam irradiation device may include an additional optical system configured to change the focusing area of the laser beam.

The control unit may derive a moving path of the laser beam irradiation device through position and shape information of the sealing unit pattern measured in the measuring unit and a value by which the focusing area is changed in size to correspond to a width of the pattern of the sealing unit.

The laser beam may be irradiated in the form of a spot beam.

The sealing path of the sealing unit may include a rectilinear path, and a distance between the measuring unit and the laser beam irradiation device may be less than that of the rectilinear path.

According to one or more embodiments of the inventive concept, a substrate-sealing method include: forming a sealing unit between a first substrate and a second substrate; measuring a pattern of the sealing unit by using a measuring unit; determining a moving path and a size of a focusing area of a laser beam irradiation device according to the pattern of the sealing unit measured in the measuring unit by a control unit; and irradiating a laser beam onto the sealing unit by using the laser beam irradiation device to seal the first and second substrates.

At least one of the first and second substrates may transmit the laser beam therethrough.

The measuring unit may move along the sealing unit to measure a position and shape of the pattern of the sealing unit.

The laser beam irradiation device may irradiates the laser beam while the measuring unit measuring the pattern of the sealing unit.

The focusing area may be adjusted in size by a motion of the laser beam irradiation device in a direction perpendicular to the first and the second substrates of the laser beam irradiation device.

The laser beam irradiation device may include an additional optical system, and the focusing area may be changed in size by the additional optical system.

The sealing unit may include a frit.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
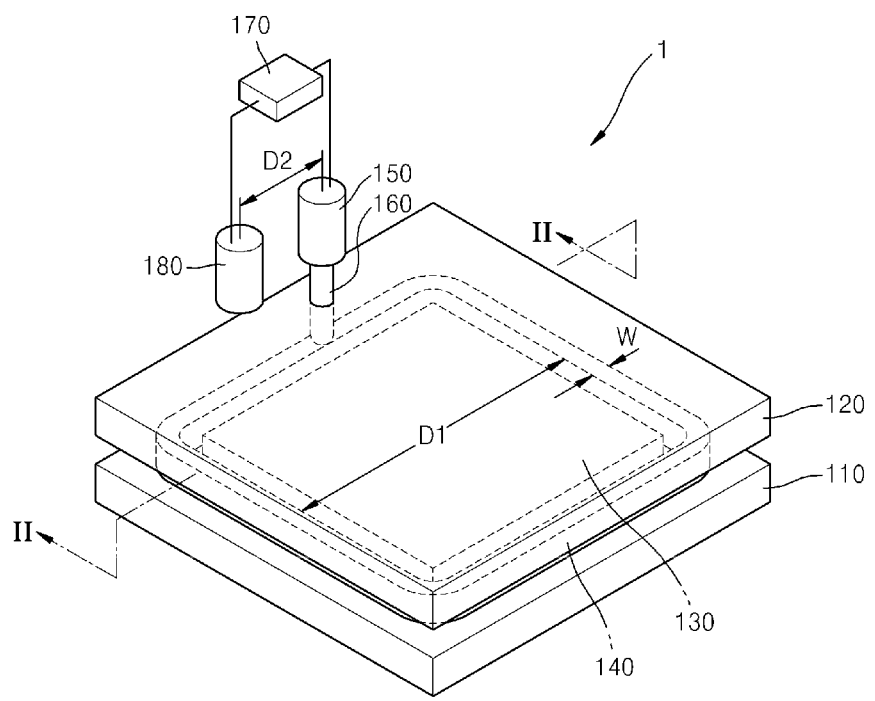
FIG. 1 is a schematic view of a substrate-sealing apparatus that seals a sealing unit of a display apparatus by using a sealing apparatus, according to an embodiment of the inventive concept.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments described below, by referring to the figures, are merely to explain aspects of the present description. Expressions such as "at least one of," when preceding a list of elements, modify the entire list of elements and do not modify the individual elements of the list.

Hereinafter, embodiments of the inventive concept will be described in detail with reference to the accompanying drawings.

Figure 2:
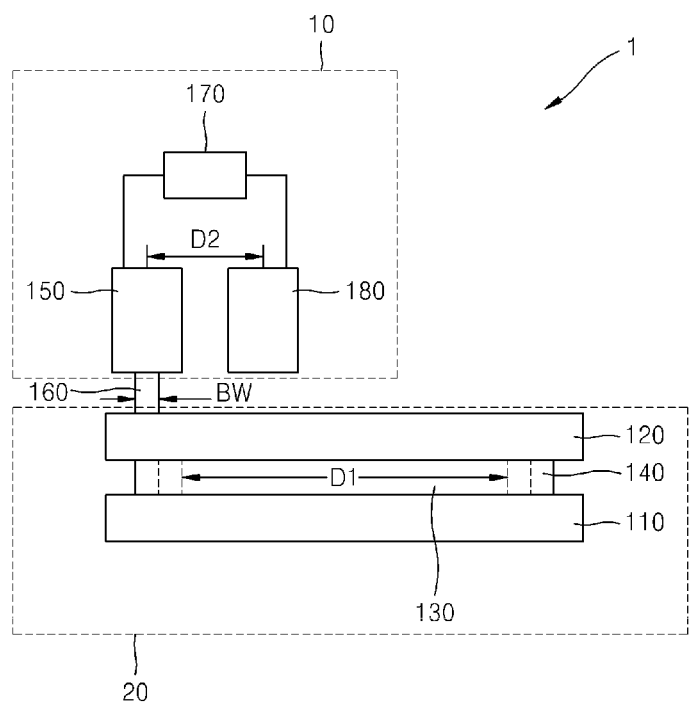
FIG. 2 is a schematic cross-sectional view taken along line II-II' of FIG. 1.

FIG. 1 is a view of a substrate-sealing apparatus 1 that seals a display apparatus 20 by using a sealing apparatus 10, according to an embodiment of the inventive concept. FIG. 2 is a cross-sectional view taken along line II-II of FIG. 1.

Referring to FIGS. 1 and 2, an organic light-emitting unit 130 and the sealing unit 140 surrounding the organic light-emitting unit 130 are disposed between first and second substrates 110 and 120. A measuring unit 180 moves along the sealing unit 140 to measure a pattern of the sealing unit 140. A laser beam irradiation device 150 follows the measuring unit 180 to irradiate a laser beam 160 onto the sealing unit 140.

The organic light-emitting unit 130 is disposed on the first substrate 110. The first substrate 110 may be a substrate formed of a glass material.

The second substrate 120 functions as an encapsulation substrate that encapsulates the organic light-emitting unit 130 disposed on the first substrate 110. The second substrate 120 may include a substrate formed of a transparent material such as a glass or a flexible plastic film so that the laser beam 160 (to be described later) passes through the second substrate 120.

The organic light-emitting unit 130 may include at least one organic light-emitting device (OLED) (not shown) in which at least one organic layer (not shown), including an emission layer, is disposed between first and second electrodes (not shown). Here, the first and second electrodes (not shown) may respectively function as an anode for injecting holes and a cathode for injecting electrons.

The OLED (not shown) may be classified into a passive matrix (PM) OLED and an active matrix (AM) OLED according to a control method. The active matrix OLED is controlled by a thin film transistor (TFT). The current embodiment of the inventive concept may be applied to any one of the PM and AM OLEDs.

The sealing unit 140 is disposed on the second substrate 120 to surround the above-described organic light-emitting unit 130.

The sealing unit 140 may form a closed loop to prevent the organic light-emitting unit 130 from being in contact with external moisture or oxygen.

Although each of edges of the sealing unit 140 forming the closed loop in FIG. 1 is curved at a predetermined curvature, the embodiment of the inventive concept is not limited thereto. The edges of the sealing unit 140 may be right-angled without having a predetermined curvature.

In the current embodiment of the inventive concept, a frit is used as the sealing unit 140 to secure the sealing between the first and second substrates 110 and 120, thereby more effectively protecting the organic light-emitting unit 130 from the moisture or the oxygen. The frit may have a predetermined width W and be formed through various methods such as a screen printing method or a pen dispensing method. The width W of the sealing unit 140 will be described in more detail with reference to FIG. 3.

In the current embodiment, although the sealing unit 140 is disposed on the second substrate 120, and the organic light-emitting unit 130 is disposed on the first substrate 110, the inventive concept is not limited thereto. For example, the sealing unit 140 may be disposed on the first substrate 110 on which the organic light-emitting unit 130 is disposed. The second substrate 120 is aligned with the first substrate 110 to adhere to the first substrate 110.

Although one organic light-emitting unit 130 is illustrated in the drawings, a plurality of organic light-emitting units 130 and a plurality of sealing units 140 that surround the plurality of organic light-emitting units 130 may be disposed between the first and second substrates 110 and 120.

The measuring unit 180 moves along the sealing unit 140 to measure a position and shape of a pattern of the sealing unit 140 (hereinafter, referred to as a sealing unit pattern). The measuring unit 180 may include a lamp (not shown), a lens (not shown), and a sensor (not shown) to measure the sealing unit pattern. When the sealing unit pattern is formed on the second substrate 120, the sealing unit pattern may not be printed at a desired position due to an alignment error in the actual process. Also, when the sealing unit pattern is printed, dried, or heat treated, a frit pattern partially increases or decreases in width. Thus, the measuring unit 180 may move along the sealing unit 140 to measure a position and shape of the sealing unit pattern in response to a change in the sealing unit pattern.

In the case where the sealing unit 140 forms the closed loop, the measuring unit 180 moves along the closed loop to measure the sealing unit pattern. Also, the measuring unit 180 may move in parallel to the second substrate 120. The measuring unit 180 may be moved by a stage (not shown) and a motor (not shown).

A control unit 170 may control a moving path (see reference numeral 151 of FIG. 3) and a size of a focusing area A of the laser beam irradiation device 150 according to the position and shape information of the sealing unit pattern, which are obtained by the measuring unit 180. The control unit 170 derives a path along which the laser beam irradiation device 150 moves while irradiating the laser beam 160 using the position and shape information of the frit pattern that is obtained from the measuring unit 180. The control unit 170 derives a value by which the focusing area A is changed in size to correspond to a width of the frit pattern. Since the moving path (see reference numeral 151 of FIG. 3) and the size of the focusing area A of the laser beam irradiation device 150 are controlled by the control unit 170, the moving path (see reference numeral 151 of FIG. 3) and the size of the focusing area A of the laser beam irradiation device 150 are optimized for the position of the frit pattern to enhance frit encapsulation quality. Also, the control unit 170 may control a cross sectional shape and a moving speed of the laser beam 160.

The laser beam irradiation device 150 follows the measuring unit 180 to irradiate the laser beam 160 along a path of the sealing unit 140 disposed between the first and second substrates 110 and 120. The laser beam 160 is irradiated onto the sealing unit 140 to form the focusing area A on the sealing unit 140.

Although not shown in detail in FIGS. 1 and 2, the laser beam irradiation device 150 may include a laser oscillator (not shown) which generates a laser beam, a beam homogenizer (not shown), and a laser head (not shown).

The laser oscillator may be a bundle type multi-core source, which is a high power laser source and is generally used for laser sealing.

In the case of the bundle type multi-core source, cores may output slightly different powers. Non-uniform outputs may be equalized by using the beam homogenizer.

The laser head (not shown) may include a reflecting unit (not shown), which reflects a laser beam generated from the laser oscillator to irradiate the laser beam onto the sealing unit 140, a driving unit (not shown) which drives the reflecting unit, and a lens unit (not shown), which focuses the reflected laser beam.

A galvanometer mirror accurately controlling a position and velocity of the laser beam may be used in a portion of the reflecting unit (not shown).

The laser beam 160 passing through the lens unit is irradiated onto the sealing unit 140 in the form of a spot beam having a Gaussian profile. The lens unit may include an F-theta lens to accurately control a focus of the laser beam 160.

Since the measuring unit 180 moves along the path of the sealing unit 140, and the laser beam irradiation device 150 follows the measuring unit 180, the laser beam 160 may be irradiated along the path of the sealing unit 140. The laser beam irradiation device 150 may move vertically and horizontally. A vertical motion for adjusting the focusing area A of the laser beam 160 is performed by a vertical moving part configured to control the distance between the laser beam irradiation device and the sealing unit. The laser beam irradiation device 150 may be moved by a stage (not shown) and a motor (not shown). Because the laser beam irradiation device 150 irradiates the laser beam 160 while the measuring unit 180 measures the pattern of the sealing unit 140, a processing time may be reduced by a time taken for measuring the position and shape of the overall frit pattern by using the typical measuring unit.

A distance D2 between the laser beam irradiation device 150 and the measuring unit 180 may be less than a distance D1 of a rectilinear path of the sealing unit 140. Because the distance D2 between the laser beam irradiation device 150 and the measuring unit 180 is decreased, the state of the sealing unit 140 that is measured in the measuring unit 180 may be more correctly reflected in the laser beam irradiation device 150. As a result, the quality of the sealing unit 140 is improved.

A substrate stage (not shown), on which the first substrate 110 is seated, may be disposed under the first substrate 110.

Figure 3:
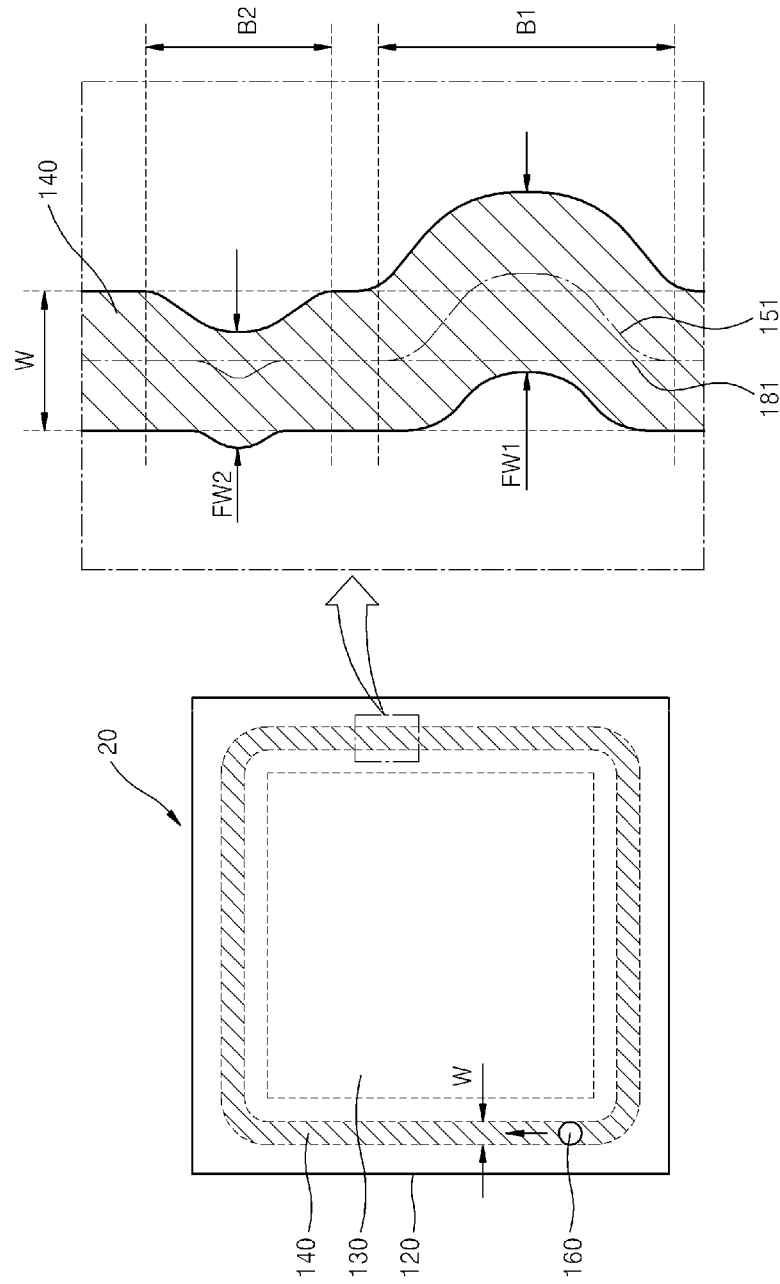
FIG. 3 is a schematic top view of the display apparatus and a laser beam.

FIG. 3 is a schematic top view of the display apparatus 20 and the laser beam 160.

Referring to FIG. 3, the sealing unit 140 is disposed between the first and second substrates 110 and 120 to surround the organic light-emitting unit 130. The sealing unit 140 may form the closed loop to prevent the organic light-emitting unit 130 from being in contact with external moisture or oxygen. Although each of corners of the sealing unit 140 forming the closed loop in FIG. 1 is curved at a predetermined curvature, the embodiment of the inventive concept is not limited thereto. The edges of the sealing unit 140 may be right-angled without having the predetermined curvature.

According to the current embodiment, the frit is used as the sealing unit 140. The frit may have a predetermined width W and formed through various methods such as the screen printing method or the pen dispensing method. However, when the frit is formed between the first and second substrates 110 and 120, the sealing unit pattern may not be correctly formed at a desired position by an alignment error in the actual process. Also, when the sealing unit pattern is printed, dried, or heat treated, a frit pattern may be partially increased or decreased in width as well as the alignment error of the sealing unit pattern may occur.

Thus, the sealing unit 140 may have a first width FW1 that is greater than the predetermined width W, or a second width FW2 that is less than the predetermined width W. The increase or decrease in the width and the alignment error between the first and second substrates 110 and 120 may occur at the same time. The alignment error under the first width FW1 that is larger than the predetermined width W may occur in a first region B1. Also, an alignment error under the second width FW2 that is less than the predetermined width W may occur in a second region B2. The measuring unit 180 may have substantially the same path as a center line of the predetermined width W and may measure a position and shape of the frit pattern. In the first region B1, the laser beam irradiation device 150 may have a moving path that is different from a path of the center line of the predetermined width W while the size of the focusing area A of the laser beam 160 increases. In the second region B1, the laser beam irradiation device 150 may have a moving path that is different from a path of the center line of the predetermined width W while the size of the focusing area A of the laser beam 160 decreases.

Figure 4A:
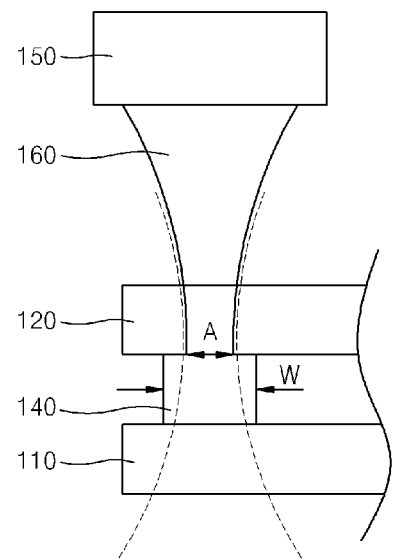
FIGS. 4A to 4C are views illustrating a vertical movement of a laser beam irradiation device according to a width of the sealing unit.
Figure 4B:
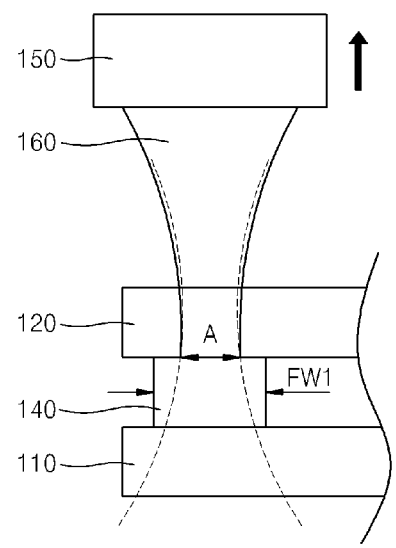
Figure 4C:
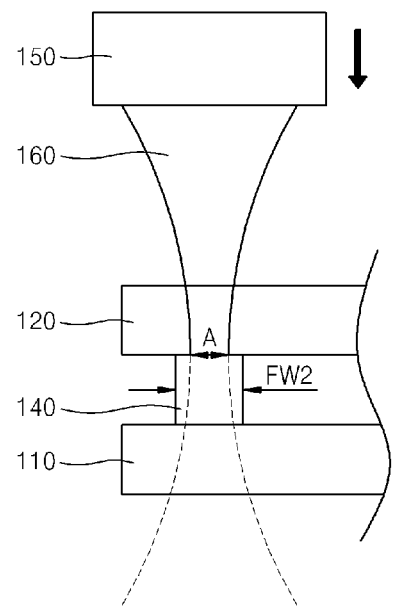

FIGS. 4A to 4C are views illustrating a vertical movement of a laser beam irradiation device 150 according to a width of a sealing unit 140.

Referring to FIG. 4A, a laser beam 160 irradiated by the laser beam irradiation device 150 passes through a second substrate 120 to reach the sealing unit 140. Because the laser beam 160 is irradiated onto the sealing unit 140, a laser focusing area A is defined on the sealing unit 140. The focal length of the laser beam 160 in which the power of the laser beam becomes maximum may be formed above the half of thickness of the frit 140. The sealing unit 140 may have a predetermined width W, i.e., a first width FW1 that is greater than the predetermined width W or a second width FW2 that is less than the predetermined width W.

Referring to FIG. 4B, the sealing unit 140 may have the first width FW1 that is greater than the predetermined width W. The laser beam irradiation device 150 may move upward to increase the laser focusing area A.

Referring to FIG. 4C, the sealing unit 140 may have the second width FW2 that is less than the predetermined width W. The laser beam irradiation device 150 may move downward to decrease the laser focusing area A laser focusing area A of the laser beam 160 may decrease.

In FIGS. 4B and 4C, a vertical motion of the laser beam irradiation device 150 may be controlled by a control unit 170. The vertical motion of the laser beam irradiation device 150 may be simultaneously performed together with a horizontal motion on the second substrate 120 of the laser beam irradiation device 150. Although the focus of the laser beam 160 is gradually blurred as the focus moves upward as in FIG. 4B. Thus, when the laser beam irradiation device 150 moves downward, the laser focusing area A may decrease, and when the laser beam irradiation device 150 moves upward, the laser focusing area A may increase.

To compensate a decrease or increase of power of the laser beam 160, the sealing apparatus may have a power control unit (not shown). The power control unit may increase or decrease the maximum power of the laser beam 160 according to the laser focusing area A. For example, the power control unit may increase the maximum power of the laser beam 160 if the laser focusing area A increase and decrease the maximum power of the laser beam 160 if the laser focusing area A decrease.

The focal length of the laser beam 160 in which the power of the laser beam becomes maximum may be formed below the half of thickness of the frit 140. In this case, the laser focusing area A is decreased if the laser irradiation device 150 move upward and the laser focusing area A is increased if the laser irradiation device 150 moves downward.

Since the laser beam irradiation device 150 may move in horizontal and vertical directions, the moving path and a size of the focusing area A of the laser beam 160 may be changed at the same time. Thus, the laser beam irradiation device 150 may actively correspond to the alignment error of the frit pattern and the partial increase or decrease in width of the frit pattern to improve frit encapsulation quality.

Figure 5:
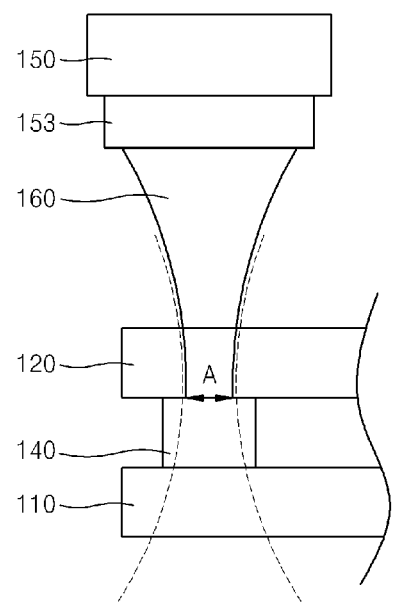
FIG. 5 is a schematic view of the laser beam irradiation device and an additional optical system.

FIG. 5 is a view illustrating the laser beam irradiation device 150 and an additional optical system 153.

Referring to FIG. 5, the laser beam irradiation device 150 may include the additional optical system 153. A laser beam 160 emitted from the laser beam irradiation device 150 passes through the additional optical system 153 to reach the sealing unit 140 through the second substrate 120. The additional optical system 153 may change the focusing area A of the laser beam.

The additional optical system 153 may include at least one lens. Because the laser beam 160 is changed in focus by horizontally or vertically moving the lens, the laser focusing area A may be changed in size. Also, the additional optical system 153 may include at least one mask. Since the laser beam 160 passes through the mask, the laser focusing area A may be changed in size.

Because the laser beam irradiation device 150 includes the additional optical system 153, the moving path and the size of the focusing area A of the laser beam 160 may be changed at the same time. Thus, the laser beam irradiation device 150 may actively correct the alignment error of the frit pattern and the partial increase or decrease in width of the frit pattern to improve frit encapsulation quality.

According to the one or more embodiments of the inventive concept, encapsulation quality may be improved. In addition, the sealing process time may be reduced.

It should be understood that the exemplary embodiments described therein should be considered in a descriptive sense only and not for purposes of limitation. Descriptions of features or aspects within each embodiment should typically be considered as available for other similar features or aspects in other embodiments. While one or more embodiments of the inventive concept have been described with reference to the figures, it will be understood by those of ordinary skill in the art that various changes in form and details may be made therein without departing from the spirit and scope of the inventive concept as defined by the following claims.

What is claimed is:
1. A sealing apparatus comprising:
a measuring unit moving above a sealing unit to measure a pattern of the sealing unit;
a laser beam irradiation device moving along the measuring unit and configured to irradiate a laser beam onto the sealing unit; and
a control unit controlling a moving path and a size of a focusing area of the laser beam irradiation device according to the pattern of the sealing unit that is measured in the measuring unit.

2. The sealing apparatus of claim 1, wherein the laser beam irradiation device has a vertical moving part configured to control the distance between the laser beam irradiation device and the sealing unit.

3. The sealing apparatus of claim 1, wherein the laser beam irradiation device further comprises an additional optical system configured to change the focusing area of the laser beam.

4. The sealing apparatus of claim 1, wherein the control unit derives a moving path of the laser beam irradiation device through position and shape information of the sealing unit pattern measured in the measuring unit and a value by which the focusing area is changed in size to correspond to a width of the pattern of the sealing unit.

5. The sealing apparatus of claim 1, wherein the laser beam is irradiated in the form of a spot beam.

6. The sealing apparatus of claim 1, wherein the sealing path of the sealing unit comprises a rectilinear path, and
a distance between the measuring unit and the laser beam irradiation device is less than that of the rectilinear path.

7. A substrate-sealing method comprising:
forming a sealing unit between a first substrate and a second substrate;
measuring a pattern of the sealing unit by using a measuring unit;
determining a moving path and a size of a focusing area of a laser beam irradiation device according to the pattern of the sealing unit measured in the measuring unit by a control unit; and
irradiating a laser beam onto the sealing unit by using the laser beam irradiation device to seal the first and second substrates.

8. The substrate-sealing method of claim 7, wherein at least one of the first and second substrates transmits the laser beam therethrough.

9. The substrate-sealing method of claim 7, wherein the measuring unit moves along the sealing unit to measure a position and shape of the pattern of the sealing unit.

10. The substrate-sealing method of claim 9, wherein the laser beam irradiation device irradiates the laser beam while the measuring unit measures the pattern of the sealing unit.

11. The substrate-sealing method of claim 7, wherein the focusing area is adjusted in size by a motion of the laser beam irradiation device in a direction perpendicular to the first and the second substrates of the laser beam irradiation device.

12. The substrate-sealing method of claim 7, wherein the laser beam irradiation device comprises an additional optical system,
the focusing area being changed in size by the additional optical system.

13. The substrate-sealing method of claim 7, wherein the sealing unit comprises a frit.

* * * * *